(12) United States Patent
Lee

(10) Patent No.: US 10,971,479 B2
(45) Date of Patent: Apr. 6, 2021

(54) SEMICONDUCTOR PACKAGE INCLUDING STACKED SEMICONDUCTOR CHIPS

(71) Applicant: SK hynix Inc., Icheon-si (KR)

(72) Inventor: Suk-Won Lee, Icheon-si (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/781,642

(22) Filed: Feb. 4, 2020

(65) Prior Publication Data

US 2021/0050328 A1 Feb. 18, 2021

(30) Foreign Application Priority Data

Aug. 12, 2019 (KR) ........................ 10-2019-0098101

(51) Int. Cl.
| H01L 25/065 | (2006.01) |
| H01L 23/522 | (2006.01) |
| H01L 23/528 | (2006.01) |

(52) U.S. Cl.
CPC ........ *H01L 25/0657* (2013.01); *H01L 23/528* (2013.01); *H01L 23/5226* (2013.01)

(58) Field of Classification Search
CPC H01L 25/0657; H01L 23/528; H01L 23/5226
See application file for complete search history.

(56) References Cited

U.S. PATENT DOCUMENTS

| 6,514,794 B2* | 2/2003 | Haba ................... H01L 23/3128 |
| | | 438/109 |
| 8,253,232 B2* | 8/2012 | Kim ....................... H01L 24/49 |
| | | 257/686 |
| 9,991,226 B2* | 6/2018 | Park ....................... H01L 23/49 |
| 10,217,722 B2* | 2/2019 | Park ....................... H01L 23/49 |
| 10,242,965 B2* | 3/2019 | Chiu ................... H01L 25/0657 |
| 10,262,972 B2* | 4/2019 | Lee ..................... H01L 25/0652 |
| 10,497,671 B2* | 12/2019 | Cho ................... H01L 25/0657 |
| 10,804,209 B2* | 10/2020 | Kang ................... H01L 23/5384 |
| 2002/0127775 A1* | 9/2002 | Haba ....................... H01L 24/48 |
| | | 438/109 |
| 2008/0042249 A1* | 2/2008 | Haba ....................... H01L 24/49 |
| | | 257/686 |
| 2008/0136006 A1* | 6/2008 | Jang ................... H01L 23/3135 |
| | | 257/686 |
| 2008/0136007 A1* | 6/2008 | Kim ................... H01L 23/3135 |
| | | 257/686 |
| 2009/0045524 A1* | 2/2009 | Mohammed .......... H01L 25/105 |
| | | 257/777 |

(Continued)

*Primary Examiner* — Nicholas J Tobergte

(74) *Attorney, Agent, or Firm* — William Park & Associates Ltd.

(57) ABSTRACT

A semiconductor package includes: a substrate; a first interposer disposed over the substrate; a first chip stack disposed on the substrate on one side of the first interposer, wherein the first chip stack includes a plurality of first semiconductor chips stacked with an offset in a first direction; a second chip stack disposed on the first chip stack, wherein the second chip stack includes a plurality of second semiconductor chips stacked with an offset in a second direction opposite to the first direction; and a third chip stack disposed on the substrate on an other side of the first interposer, wherein the third chip stack includes a plurality of third semiconductor chips stacked with an offset in the second direction.

18 Claims, 10 Drawing Sheets

(56) References Cited

U.S. PATENT DOCUMENTS

| | | | |
|---|---|---|---|
| 2010/0244227 A1* | 9/2010 | Kim | H01L 23/49 257/692 |
| 2013/0056882 A1* | 3/2013 | Kim | H01L 23/16 257/777 |
| 2014/0103542 A1* | 4/2014 | Katagiri | H01L 23/498 257/777 |
| 2015/0061157 A1* | 3/2015 | Yu | H01L 25/50 257/777 |
| 2015/0200187 A1* | 7/2015 | Park | H01L 24/49 257/777 |
| 2018/0277529 A1* | 9/2018 | Matsumoto | H01L 25/0657 |
| 2019/0035705 A1* | 1/2019 | Mao | H01L 24/32 |
| 2020/0013767 A1* | 1/2020 | Baik | H01L 24/48 |

* cited by examiner

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2019-0098101 filed on Aug. 12, 2019, which is incorporated herein by reference in its entirety.

BACKGROUND

1. Field

This patent document relates to a semiconductor package, and more particularly, to a semiconductor package including a plurality of chips stacked over a substrate.

2. Discussion of the Related Art

The evolution of electronic devices used to process large amounts of data is directed toward smaller volumes. Thus, the need to increase the degree of integration of such electronic devices is growing.

Due to a limitation of semiconductor integration technology, required performance goals are rarely satisfied by only a single semiconductor chip. Thus, semiconductor packages having a plurality of embedded semiconductor chips generally fabricated.

Although a semiconductor package includes the plurality of semiconductor chips, various requirements such as an improvement in accuracy and speed of operation, a minimized size, process simplification, and cost reduction need to be satisfied.

SUMMARY

Various embodiments are directed to a semiconductor package having high integration with a relatively low footprint.

In an embodiment, a semiconductor package may include: a substrate; a first interposer disposed over the substrate; a first chip stack disposed on the substrate on one side of the first interposer, wherein the first chip stack includes a plurality of first semiconductor chips stacked with an offset in a first direction; a second chip stack disposed on the first chip stack, wherein the second chip stack includes a plurality of second semiconductor chips stacked with an offset in a second direction opposite to the first direction; and a third chip stack disposed on the substrate on an other side of the first interposer, wherein the third chip stack includes a plurality of third semiconductor chips stacked with an offset in the second direction. The first interposer may be contacted by a bottom surface of the second chip stack that protrudes beyond the first chip stack in the first direction. The third chip stack may have a thickness larger than the sum of thicknesses of the first and second chip stacks. Further, the third chip stack may extend over at least a portion of the first interposer so that the at least a portion of the first interposer is located in a space under the third chip stack.

DETAILED DESCRIPTION

Figure 1:
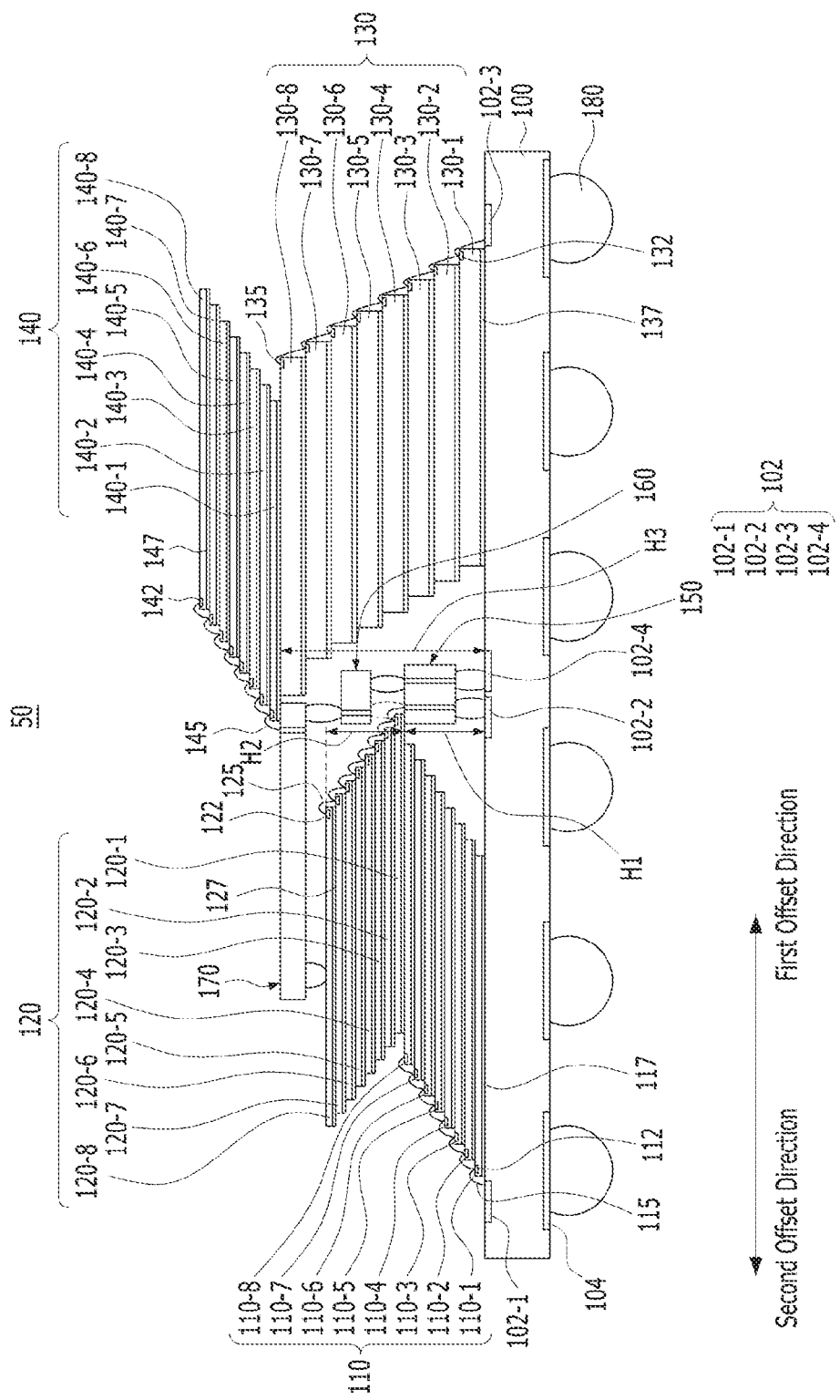
FIG. 1 is a cross-sectional view illustrating a semiconductor package in accordance with an embodiment.

Various examples and implementations of the disclosed technology are described below in detail with reference to the accompanying drawings.

The drawings might not be necessarily to scale, and in some instances, proportions of at least some of the structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating a semiconductor package 50 in accordance with an embodiment.

Referring to FIG. 1, the semiconductor package 50 may include a substrate 100, first to fourth chip stacks 110, 120, 130, and 140, and first to third interposers 150, 160, and 170, which are disposed over the substrate 100.

The substrate 100 may be a board for the semiconductor package 50, such as a printed circuit board (PCB), which has a circuit and/or wiring structure to transfer electrical signals.

The substrate 100 may have a first surface on which various electronic elements included in the semiconductor package 50, for example, the first to fourth chip stacks 110, 120, 130, and 140 and the first to third interposers 150, 160, and 170 may be disposed and a second surface which may be located on the opposite side of the first surface and on which terminals for connecting the semiconductor package 50 to the outside may be disposed. The first surface may be referred to as a top surface, and the second surface may be referred to as a bottom surface.

The substrate 100 may include first substrate pads 102 and second substrate pads 104. The first substrate pads 102 may be disposed on the first surface so as to electrically connect the electronic elements to the substrate 100, and the second substrate pads 102 may be disposed on the second surface so as to electrically connect external connection terminals 180 to the substrate 100. For reference, the substrate pads may indicate conductive elements or terminals which are disposed on the top and bottom surfaces of the substrate 100 in order to connect the substrate 100 to other components. For example, the first substrate pads 102 may be bond fingers for wire bonding, and the second substrate pads 104 may be ball lands for bonding solder balls. The first and second substrate pads 102 and 104 may be parts of the circuit and/or wiring structure within the substrate 100. The first substrate pads 102 may include four substrate pads 102-1 to 102-4 for connection with the first chip stack 110, the second chip stack 120, the third chip stack 130, and the fourth chip stack 140, respectively. However, the numbers and arrangement of the first and second substrate pads 102 and 104 may be modified in various manners.

The first to fourth chip stacks 110, 120, 130, and 140 may be disposed on the first surface of the substrate 100.

The first chip stack 110 may include a plurality of first semiconductor chips 110-1 to 110-8 stacked with an offset in a stair shape. In the present embodiment, it is described that the first chip stack 110 includes the eight first semiconductor chips 110-1 to 110-8. However, the number of the first semiconductor chips included in the first chip stack 110 may be changed to various values. For convenience of description, the first semiconductor chips are sequentially represented by reference numerals 110-1 to 110-8 in ascending order of distance from the substrate 100. Any one of the first semiconductor chips 110-1 to 110-8, for example, the first semiconductor chip 110-1 may be stacked with an offset in a direction parallel to the first surface of the substrate 100 from another semiconductor chip adjacent in the stacking direction, for example, the first semiconductor chip 110-2. The offset direction of the first semiconductor chips 110-1 to 110-8 is hereafter referred to as a first offset direction or a first direction. In the present cross-sectional view, the first offset direction may correspond to the right-hand direction. As the first semiconductor chips 110-1 to 110-8 are offset-stacked, the top surfaces of the first semiconductor chips 110-1 to 110-8 may be partially exposed, the top surfaces being extended from one side surfaces of the first semiconductor chips 110-1 to 110-8, located in the opposite side of the first offset direction, for example, left side surfaces.

The first semiconductor chips 110-1 to 110-8 may be the same chips in that the first semiconductor chips 110-1 to 110-8 may have the same type, thickness, and plan size, and include first chip pads 112 located at the same positions. Furthermore, the first semiconductor chips 110-1 to 110-8 may be memory chips. For example, each of the first semiconductor chips 110-1 to 110-8 may be a nonvolatile memory chip such as a NAND flash memory, phase-change random access memory (PRAM), or magneto-resistive RAM (MRAM) or a volatile memory chip such as a dynamic RAM (DRAM) or a static RAM (SRAM).

Each of the first semiconductor chips 110-1 to 110-8 may have a first surface facing the substrate 100, for example, a bottom surface, and a second surface located in the opposite side of the first surface, for example, a top surface. The first chip pads 112 may be disposed on the respective second surfaces of the first semiconductor chips 110-1 to 110-8. In particular, the first chip pads 112 may be disposed in portions of the top surfaces of the first semiconductor chips 110-1 to 110-8, respectively, which are exposed as the first semiconductor chips 110-1 to 110-8 are offset-stacked. FIG. 1 is a cross-sectional view taken along the first offset direction and a second offset direction, also referred to as a second direction, which is the opposite direction of the first offset direction, illustrating that one first chip pad 112 is formed in each of the first semiconductor chips 110-1 to 110-8. However, a plurality of first chip pads 112, which are arranged in a direction substantially perpendicular to the first and second offset directions while being parallel to the first surface of the substrate 100, may be formed in each of the first semiconductor chips 110-1 to 110-8.

A first inter-connector 115 may be formed on one side of the first chip stack 110, for example, the left side. The first inter-connector 115 may electrically connect the first chip stack 110 to the substrate 100 while electrically connecting the first semiconductor chips 110-1 to 110-8 to each other. In the present embodiment, the first inter-connector 115 may be a bonding wire which connects the first chip pad 112 of the first semiconductor chip 110-1 to the first substrate pad 102-1 while connecting the first chip pads 112 adjacent to each other. However, the present embodiment is not limited thereto, and various types of electrical inter-connectors such as a lead, conductive tape, conductive spacer and through-via electrode may be used.

The first semiconductor chips 110-1 to 110-8 may be attached to the substrate 100 and the first semiconductor chips 110-1 to 110-7, which are located immediately under the respective first semiconductor chips 110-1 to 110-8, through a first adhesive layer 117. The first adhesive layer 117 may be formed on the bottom surface of each of the first semiconductor chips 110-1 to 110-8, and may fully or partially cover the bottom surface. The first adhesive layer 117 may include an insulating adhesive material such as a die attach film (DAF). The first adhesive layer 117 may insulate the first semiconductor chips 110-1 to 110-8 from each other or insulate the substrate 100 from the first semiconductor chip 110-1.

The thickness of the first chip stack 110, i.e. a distance from the top surface of the substrate 100 to the top surface of the uppermost first semiconductor chip 110-8, is referred to as a first thickness H1.

The second chip stack 120 may be disposed on the first chip stack 110. The second chip stack 120 may include a plurality of second semiconductor chips 120-1 to 120-8 stacked with an offset in a stair shape. In the present embodiment, it is described that the second chip stack 120 includes the eight second semiconductor chips 120-1 to 120-8. However, the number of the second semiconductor chips included in the second chip stack 120 may be changed to various values. For convenience of description, the second semiconductor chips are sequentially represented by reference numerals 120-1 to 120-8 in ascending order of distance from the substrate 100. The second semiconductor chips 120-1 to 120-8 may be offset-stacked in the second offset direction, for example, the left-hand direction. As the second semiconductor chips 120-1 to 120-8 are offset-stacked, the top surfaces of the second semiconductor chips 120-1 to 120-8 may be partially exposed, the top surfaces being extended from the other side surfaces of the second semiconductor chips 120-1 to 120-8, located in the opposite side of the second offset direction, for example, right side surfaces.

The second semiconductor chips 120-1 to 120-8 may be the same chips in that the second semiconductor chips 120-1 to 120-8 may have the same type, thickness, and plan size, and include second chip pads 122 located at the same positions. Furthermore, the second semiconductor chips 120-1 to 120-8 may be memory chips. Moreover, the second semiconductor chips 120-1 to 120-8 may be the same types of chips as the first semiconductor chips 110-1 to 110-8, and have the same thickness and plan size as the first semiconductor chips 110-1 to 110-8.

Each of the second semiconductor chips 120-1 to 120-8 may have a first surface facing the substrate 100, for example, a bottom surface, and a second surface located in the opposite side of the first surface, for example, a top surface. The second chip pads 122 may be disposed on the respective second surfaces of the second semiconductor chips 120-1 to 120-8. The second chip pads 122 may be disposed in portions of the top surfaces of the second semiconductor chips 120-1 to 120-8, respectively, which are exposed as the second semiconductor chips 120-1 to 120-8 are offset-stacked. Although not illustrated in FIG. 1, each of the second semiconductor chips 210-1 to 210-8 may include a plurality of second chip pads 122 which are arranged in a third direction which is parallel to the first surface of the substrate 100 and substantially perpendicular to the first and second offset directions (see FIG. 2B).

A second inter-connector 125 may be formed on the other side of the second chip stack 120, for example, the right side. The second inter-connector 125 may electrically connect the second chip stack 120 to the first interposer 150 while electrically connecting the second semiconductor chips 120-1 to 120-8 to each other. The second chip stack 120 may be electrically connected to the substrate 100 through the first interposer 150. The first interposer 150 is described below with reference to FIGS. 2A and 2B. In the present embodiment, the second inter-connector 125 may be a bonding wire which connects the second chip pads 122 of the second semiconductor chip 120-1 to a portion of the first interposer 150, for example, a via pad to be described below, while connecting the second chip pads 122 adjacent to each other.

The second semiconductor chips 120-1 to 120-8 may be attached to the uppermost first semiconductor chip 110-8 and the first interposer 150 and the second semiconductor chips 120-1 to 120-7, which are located immediately under the respective second semiconductor chips 120-1 to 120-8, through a second adhesive layer 127.

The thickness of the second chip stack 120, i.e. a distance from the top surface of the first chip stack 110 to the top surface of the uppermost second semiconductor chip 120-8 is referred to as a second thickness H2. When the second semiconductor chips 120-1 to 120-8 have the same thickness as the first semiconductor chips 110-1 to 110-8, the first thickness H1 and the second thickness H2 may be substantially equal to each other. In another embodiment, however, the first thickness H1 and the second thickness H2 may be different from each other.

Thus, a stacked structure of the first chip stack 110 and the second chip stack 120 may be disposed on the first surface of the substrate 100 while having a staggered arrow shape facing in the first offset direction.

The third chip stack 130 may be located next to the stacked structure of the first and second chip stacks 110 and 120 with the first and second interposers 150 and 160 interposed therebetween. For example, when the first and second chip stacks 110 and 120 are disposed on the left side of the first and second interposers 150 and 160, the third chip stack 130 may be disposed on the right side of the first and second interposers 150 and 160. The third chip stack 130 may include a plurality of third semiconductor chips 130-1 to 130-8 stacked with an offset in a stair shape. In the present embodiment, it is described that the third chip stack 130 includes the eight third semiconductor chips 130-1 to 130-8. However, the number of the third semiconductor chips included in the third chip stack 130 may be changed to various values. For convenience of description, the third semiconductor chips are sequentially represented by reference numerals 130-1 to 130-8 in ascending order of distance from the substrate 100. The third semiconductor chips 130-1 to 130-8 may be offset-stacked in the second offset direction, for example, the left-hand direction. As the third semiconductor chips 130-1 to 130-8 are offset-stacked, the top surfaces of the third semiconductor chips 130-1 to 130-8 may be partially exposed, the top surfaces being extended from the other side surfaces of the third semiconductor chips 130-1 to 130-8, located in the opposite side of the second offset direction, for example, right side surfaces.

The third semiconductor chips 130-1 to 130-8 may be the same chips in that the third semiconductor chips 130-1 to 130-8 may have the same type, thickness, and plan size, and include chip pads 132 located at the same positions. Furthermore, the third semiconductor chips 130-1 to 130-8 may be memory chips. Moreover, the third semiconductor chips 130-1 to 130-8 may be the same types of chips as or different types of chips from the first semiconductor chips 110-1 to 110-8 and/or the second semiconductor chips 120-1 to 120-8, and have the same plan size as or a different plan size from the first semiconductor chips 110-1 to 110-8 and/or the second semiconductor chips 120-1 to 120-8. However, each of the third semiconductor chips 130-1 to 130-8 may have a larger thickness than each of the first semiconductor chips 110-1 to 110-8 and the second semiconductor chips 120-1 to 120-8. Although the third semiconductor chips 130-1 to 130-8 may be the same types of chips as the first semiconductor chips 110-1 to 110-8 and the second semiconductor chips 120-1 to 120-8, the degree of back grinding may be reduced more than during a back grinding process for the first semiconductor chips 110-1 to 110-8 and the second semiconductor chips 120-1 to 120-8, such that the third semiconductor chips 130-1 to 130-8 have a larger thickness than the first semiconductor chips 110-1 to 110-8 and the second semiconductor chips 120-1 to 120-8. Therefore, when the thickness of the third chip stack 130, i.e. a distance from the top surface of the substrate 100 to the top surface of the uppermost third semiconductor chip 130-8 is referred to as a third thickness H3, the third thickness H3 may be larger than each of the first thickness H1 and the second thickness H2. In the present embodiment, the third thickness H3 may be larger than the sum of the first thickness H1 and the second thickness H2. This is in order to reduce the area of the package by pushing portions of the first and second interposers 150 and 160 and/or portions of the first and second chip stacks 110 and 120 into a space which is formed under the third chip stack 130 as the third chip stack 130 is offset-stacked to have the third thickness H3.

Each of the third semiconductor chips 130-1 to 130-8 may have a first surface facing the substrate 100, for example, a bottom surface, and a second surface located on the opposite side of the first surface, for example, a top surface. The third chip pads 132 may be disposed on the respective second surfaces of the third semiconductor chips 130-1 to 130-8. The third chip pads 132 may be disposed in portions of the top surfaces of the third semiconductor chips 130-1 to 130-8, respectively, which are exposed as the third semiconductor chips 130-1 to 130-8 are offset-stacked.

A third inter-connector 135 may be formed on the other side of the third chip stack 130, for example, the right side. The third inter-connector 135 may electrically connect the third chip stack 130 to the substrate 100 while electrically connecting the third semiconductor chips 130-1 to 130-8 to each other. In the present embodiment, the third inter-connector 135 may be a bonding wire which connects the third chip pad 132 of the third semiconductor chip 130-1 to the first substrate pad 102-3 while connecting the third chip pads 132 adjacent to each other.

The third semiconductor chips 130-1 to 130-8 may be attached to the substrate 100 and the third semiconductor chips 130-1 to 130-7, which are located immediately under the respective third semiconductor chips 130-1 to 130-8, through a third adhesive layer 137.

The fourth chip stack 140 may be located over the third chip stack 130. The fourth chip stack 140 may include a plurality of fourth semiconductor chips 140-1 to 140-8 stacked with an offset in a stair shape. In the present embodiment, it is described that the fourth chip stack 140 includes the eight fourth semiconductor chips 140-1 to 140-8. However, the number of the fourth semiconductor chips included in the fourth chip stack 140 may be changed to various values. For convenience of description, the fourth semiconductor chips are sequentially represented by reference numerals 140-1 to 140-8 in ascending order of distance from the substrate 100. The fourth semiconductor chips 140-1 to 140-8 may be offset-stacked in the first offset direction, for example, the right-hand direction. As the fourth semiconductor chips 140-1 to 140-8 are offset-stacked, the top surfaces of the fourth semiconductor chips 140-1 to 140-8 may be partially exposed, the top surfaces being extended from one side surfaces of the fourth semiconductor chips 140-1 to 140-8, located in the opposite side of the first offset direction, for example, left side surfaces.

The fourth semiconductor chips 140-1 to 140-8 may be the same chips in that the fourth semiconductor chips 140-1 to 140-8 may have the same type, thickness, and plan size, and include chip pads 142 located at the same positions. Furthermore, the fourth semiconductor chips 140-1 to 140-8 may be memory chips. Moreover, the fourth semiconductor chips 140-1 to 140-8 may be the same type of chips as the first semiconductor chips 110-1 to 110-8 and/or the second semiconductor chips 120-1 to 120-8, and have the same thickness and plan size as the first semiconductor chips 110-1 to 110-8 and/or the second semiconductor chips 120-1 to 120-8. In this case, the fourth chip stack 140 may have substantially the same thickness as the first thickness H1 and/or the second thickness H2.

Each of the fourth semiconductor chips 140-1 to 140-8 may have a first surface facing the substrate 100, for example, a bottom surface, and a second surface located in the opposite side of the first surface, for example, a top surface. The fourth chip pads 142 may be disposed on the respective second surfaces of the fourth semiconductor chips 140-1 to 140-8. The fourth chip pads 142 may be disposed in portions of the top surfaces of the fourth semiconductor chips 140-1 to 140-8, respectively, which are exposed as the fourth semiconductor chips 140-1 to 140-8 are offset-stacked.

A fourth inter-connector 145 may be formed on one side of the fourth chip stack 140, for example, the left side. The fourth inter-connector 145 may electrically connect the fourth chip stack 140 to the third interposer 170 while electrically connecting the fourth semiconductor chips 140-1 to 140-8 to each other. The fourth chip stack 140 may be electrically connected to the substrate 100 through the third interposer 170, the second interposer 160, and the first interposer 150. The third interposer 170 and the second interposer 160 are described below. In the present embodiment, the fourth inter-connector 145 may be a bonding wire which connects the fourth chip pads 142 of the fourth semiconductor chip 140-1 to a portion of the third interposer 170, for example, a via pad to be described below, while connecting the fourth chip pads 142 adjacent to each other.

The fourth semiconductor chips 140-1 to 140-8 may be attached to the uppermost third semiconductor chip 130-8 and the third interposer 170 and the fourth semiconductor chips 140-1 to 140-7, which are located immediately under the respective fourth semiconductor chips 140-1 to 140-8, through a fourth adhesive layer 147.

Thus, a stacked structure of the third chip stack 130 and the fourth chip stack 140 may be disposed on the first surface of the substrate 100 while having a staggered arrow shape facing in the second offset direction.

The first interposer 150 may be formed on the first surface of the substrate 100, and disposed between the first chip stack 110 and the third chip stack 130, that is, between the other side of the first chip stack 110, for example, the right side and the one side of the third chip stack 130, for example, the left side. The thickness of the first interposer 150, i.e. a distance from the top surface of the substrate 100 to the top surface of the first interposer 150, may be substantially equal to the first thickness H1 of the first chip stack 110.

The first interposer 150 may be spaced a distance from the first chip stack 110. Furthermore, a portion of the first interposer 150 may be overlapped by the bottom surface of the second chip stack 120, which partially protrudes toward the other side, for example, the right side from the first chip stack 110. In other words, the first interposer 150 may be disposed so as to be overlapped by the protruding portion of the second chip stack 120, which is not directly supported by the first chip stack 110. Thus, the first interposer 150 may serve to support the second chip stack 120 with the first chip stack 110. Furthermore, the first interposer 150 may serve to electrically connect the second chip stack 120 to the substrate 100, and electrically connect the second interposer 160 disposed on the first interposer 150 to the substrate 100. This structure is described in more detail with reference to FIGS. 2A and 2B.

Figure 2A:
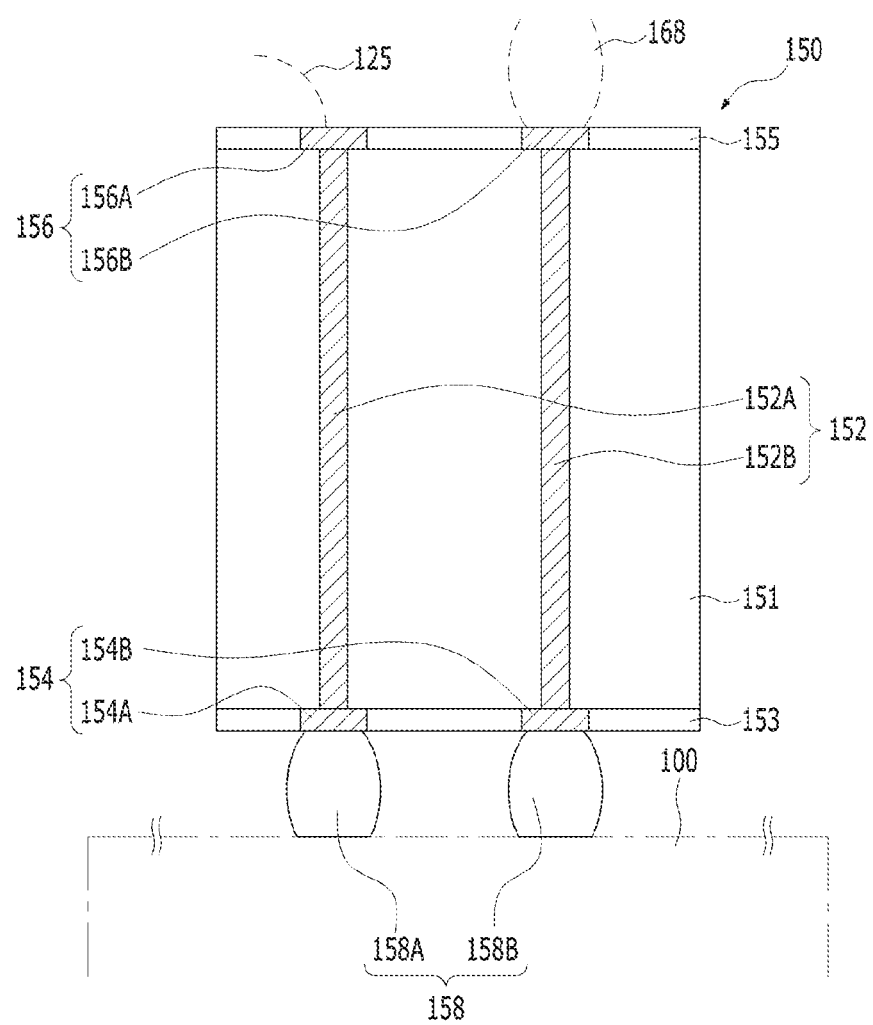
FIGS. 2A and 2B are cross-sectional and plan views illustrating an example of the first interposer 150 of FIG. 1 in more detail.
Figure 2B:
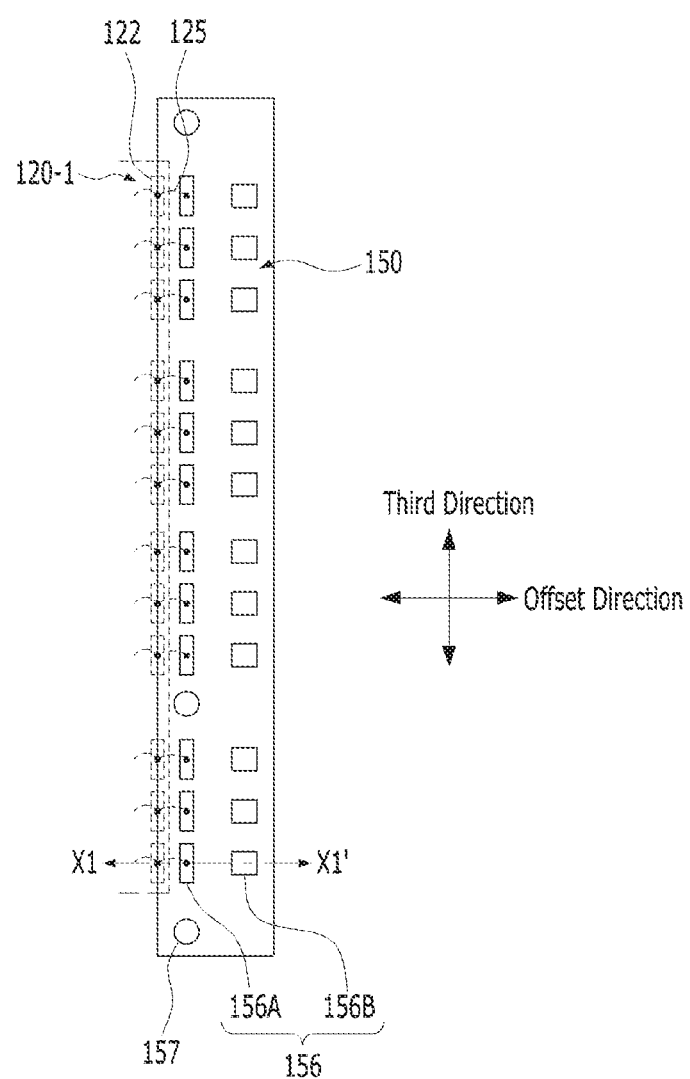

FIGS. 2A and 2B are cross-sectional and plan views illustrating an example of the first interposer 150 of FIG. 1 in more detail. FIG. 2A illustrates a cross-section taken along line X1-X1' of FIG. 2B, and FIG. 2B illustrates the top surface of the first interposer 150. For convenience of description, FIGS. 2A and 2B illustrate the first interposer 150 and portions of the components connected to the first interposer 150, for example, portions of the second chip stack 120 and the second interposer 160.

Referring to FIGS. 1, 2A and 2B, the first interposer 150 may include a first body part 151, 153, and 155, a first through via structure 152, 154, and 156 formed through the first body part 151, 153, and 155, and a first connection terminal 158 formed under the first body part 151, 153, and 155 so as to provide connection between the first through via structure 152, 154, and 156 and the substrate 100.

The first body part 151, 153, and 155 may have a rectangular cylinder shape or a similar shape thereto as a whole, and include a first body 151 and first lower and upper dielectric layers 153 and 155 disposed at the bottom and top of the first body 151, respectively. The first body 151 may include a semiconductor material such as silicon. Each of the first lower and upper dielectric layers 153 and 155 may include a dielectric material such as silicon oxide, silicon nitride, or a combination thereof.

The first body part 151, 153, and 155 may have a bar shape which is relatively long in the third direction. That is because, as described above, the second chip pads 122 arranged in the third direction are provided on the respective top surfaces of the second semiconductor chips 120-1 to 120-8 included in the second chip stack 120, and the first through via structure 152, 154, and 156 connected to the respective second chip pads 122 are arranged in the third direction within the first body part 151, 153, and 155. The first body part 151, 153, and 155 may have a larger length than the second chip stack 120 in the third direction. This is in order to provide a space in which a dummy pattern (see portion indicated by a dotted line of FIG. 1 and DP1 of FIG. 3A) for supporting the second interposer 160 to be described below is disposed.

The first through via structure 152, 154, and 156 may include a first through vias 152, first lower via pads 154, and first upper via pads 156. The first through vias 152 may be extended in a direction perpendicular to the first surface of the substrate 100 through the first body 151, and the first lower and upper via pads 154 and 156 may be formed in the first lower and upper dielectric layers 153 and 155, respectively, and connected to the bottom and top of the first through via 152, respectively. The first lower via pad 154 and the first upper via pad 156 may have a larger plan area than the first through via 152. The first through via structure 152, 154, and 156 may include a conductive material such as a metal, metal nitride, or a combination thereof.

The first through via structure 152, 154, and 156 may include a one-side first through via structure 152A, 154A, and 156A and an other-side first through via structure 152B, 154B, and 156B. The one-side first through via structure 152A, 154A, and 156A may be electrically connected to the second chip stack 120 and disposed relatively close to the second chip stack 120 in the offset direction, and the other-side first through via structure 152B, 154B, and 156B may be electrically connected to the second interposer 160 and disposed relatively far from the second chip stack 120 in the offset direction. As illustrated in the plan view, one-side first upper via pads 156A may be arranged in a line in the third direction while being located relatively on the left side, and connected to the corresponding second chip pads 122 of the second semiconductor chip 120-1 through the second inter-connector 125, and other-side first upper via pads 156B may be arranged in a line in the third direction while being located relatively on the right side, and connected to second connection terminals 168 of the second interposer 160 which is described below. When the one-side first upper via pad 156A is used for wire bonding and the other-side first upper via pad 156B is used for contact with the second connection terminal 168 of the second interposer 160, the one-side first upper via pad 156A and the other-side first upper via pad 156B may have different shapes and/or sizes. However, the present embodiment is not limited thereto, but the one-side first upper via pad 156A and the other-side first upper via pad 156B may have the same shape and/or size.

When the one-side first upper via pad 156A is provided for wire bonding and the other-side first upper via pad 156B is provided for contact with the second connection terminal 168 of the second interposer 160, the second connection terminal 168 under the other side of the second interposer 160 supports the second interposer 160, but no support part is present under the one side of the second interposer 160. In this case, the second interposer 160 may be inclined to the one side. In order to prevent the inclination, a dummy pattern (see DP1 of FIG. 3A) serving as a support part may be present under the one side of the second interposer 160. For connection with the dummy pattern, a first dummy pad 157 may be further formed in an empty space on the line where the one-side first upper via pads 156A are arranged. As illustrated in FIG. 2B, the first dummy pad 157 may be formed in a space between the one-side first upper via pads 156A in the second direction, or formed in an additional space which is formed because the length of the first interposer 150 in the third direction is larger than that of the second chip stack 120, that is, at both ends of the first interposer 150 in the third direction. The first dummy pad 157 may be formed in the first upper dielectric layer 155 such that the top surface thereof is exposed, like the upper via pad 156. For convenience of description, FIG. 2B illustrates that the first dummy pads 157 have a circular shape. However, the present embodiment is not limited thereto, but the arrangement, number, shape and size of the first dummy pads 157 may be modified in various manners.

The one-side first upper via pad 156A may be connected to a one-side first connection terminal 158A through the corresponding one-side first through via 152A and the corresponding one-side first lower via pad 154A, and the other-side first upper via pad 156B may be connected to an other-side first connection terminal 158B through the corresponding other-side first through via 152B and the corresponding other-side first lower via pad 154B. Because the one-side first lower via pad 154A and the other-side first lower via pad 154B are provided for connection with the first connection terminal 158, the one-side first lower via pad 154A and the other-side first lower via pad 154B may be arranged at the same positions as the one-side first upper via pad 156A and the other-side first upper via pad 156B, respectively, and have the same shape and size as the one-side first upper via pad 156A and the other-side first upper via pad 156B, respectively. However, the present embodiment is not limited thereto, but the one-side first lower via pad 154A and the other-side first lower via pad 154B may have different shapes and/or sizes.

The one-side first connection terminal 158A may be connected to the first substrate pad 102-2, and the other-side first connection terminal 158B may be connected to the first substrate pad 102-4. In the present embodiment, the first connection terminal 158 may include a conductive bump. However, the present embodiment is not limited thereto, but various shapes of electrical connectors including various conductive materials may be used as the first connection terminal 158.

Thus, the second chip stack 120 may be electrically connected to the substrate 100 through the first interposer 150, or specifically a path running through the second inter-connector 125, the one-side first through via structure 152A, 154A, and 156A and the one-side first connection terminal 158A.

In the present embodiment, the first interposer 150 having the illustrated shape has been described. However, the present embodiment is not limited thereto. A substrate, a semiconductor chip and the like, which have various shapes and various wiring structures capable of providing electrical connection between the second chip stack 120 and the substrate 100, may be used as the first interposer 150.

The second interposer 160 may be disposed between the second chip stack 120 and the third chip stack 130, while disposed over the first interposer 150. Because the third interposer 170 connected to the fourth chip stack 140 extends over the top surface of the second chip stack 120 while the first and second interposers 150 and 160 and/or the first and second chip stacks 110 and 120 are pushed into the space under the third chip stack 130 having the third thickness H3, it is difficult to directly connect the third interposer 170 to the first interposer 150. The second interposer 160 may serve to compensate for physical and electrical separation between the first interposer 150 and the third interposer 170. In other words, while the space between the first interposer 150 and the third interposer 170 is supported in the vertical direction by the second interposer 160, electrical connection may be provided between the first interposer 150 and the third interposer 170. The thickness of the second interposer 160, that is, the distance from the top surface of the first interposer 150 to the top surface of the second interposer 160 may be equal to or less than the second thickness H2 of the second chip stack 120. The second interposer 160 is described in more detail with reference to FIGS. 3A to 3C.

Figure 3A:
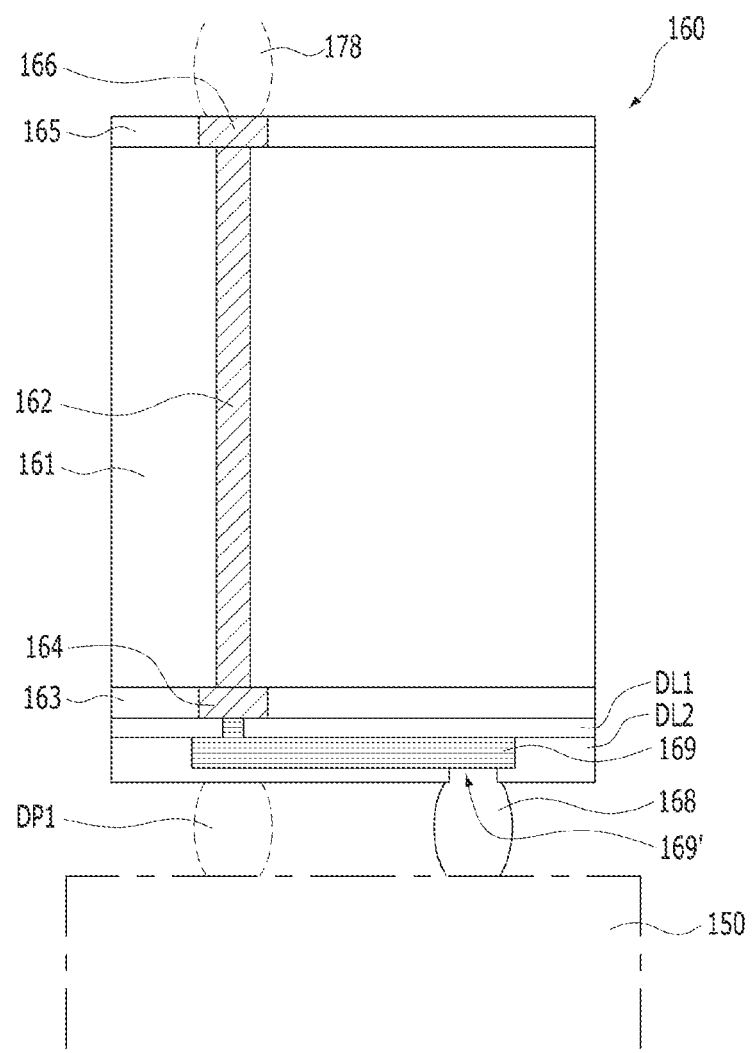
FIGS. 3A, 3B, and 3C are diagrams illustrating an example of the second interposer 160 of FIG. 1 in more detail.
Figure 3B:
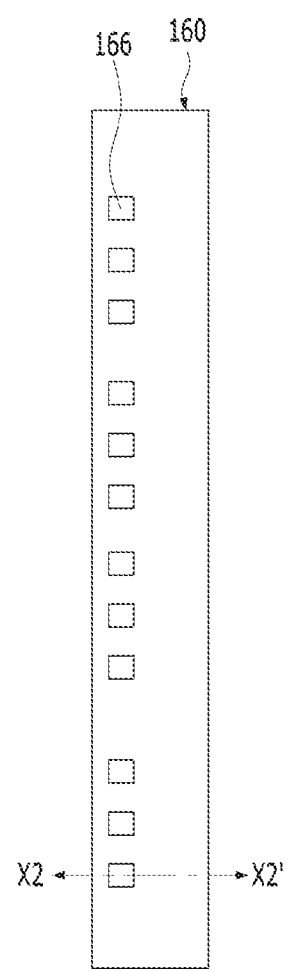
Figure 3C:
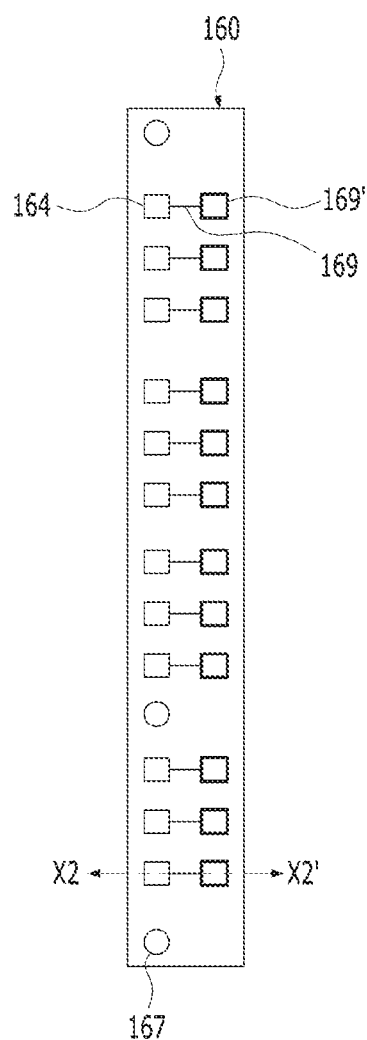

FIGS. 3A to 3C are diagrams illustrating an example of the second interposer 160 of FIG. 1 in more detail. FIG. 3A illustrates a cross-section taken along line X2-X2' of FIG. 3B or 3C, FIG. 3B illustrates the top surface of the second interposer 160, and FIG. 3C illustrates the bottom surface of the second interposer 160 except the second connection terminal 168 and a first dummy pattern DP1. For convenience of description, FIG. 3A illustrates the second interposer 160 and portions of the components connected to the second interposer 160, for example, parts of the first and third interposers 150 and 170.

Referring to FIGS. 1, 3A, 3B, and 3C, the second interposer 160 may include a second body part 161, 163, and 165, a second through via structure 162, 164, and 166 formed through the second body part 161, 163, and 165, the second connection terminal 168 formed under the second body part 161, 163, and 165 so as to provide connection between the second through via structure 162, 164, and 166 and the first interposer 150, and the first dummy pattern DP1 for supporting the second interposer 160.

The second body part 161, 163, and 165 may have a rectangular cylinder shape or a similar shape thereto as a whole, and include a second body 161 and second lower and upper dielectric layers 163 and 165 disposed at the bottom and top of the second body 161. When seen from the top, the second body part 161, 163, and 165 may have the same or similar shape as or to the first body part 151, 153, and 155 while overlapping the first body part 151, 153, and 155. This is in order to provide a space in which redistribution pads 169' arranged to overlap the other-side first upper via pads 156B and second dummy pads 167 arranged to overlap the first dummy pads 157 are formed. The redistribution pad 169' and the second dummy pad 167 is described below.

The second through via structure 162, 164, and 166 may include a second through via 162 and second lower and upper via pads 164 and 166. The second through via 162 may be extended in the vertical direction through the second body 161, and the second lower and upper via pads 164 and 166 may be formed in the second lower and upper dielectric layers 163 and 165, respectively, and connected to the bottom and top of the second through via 162, respectively.

The second through via structure 162, 164, and 166 may be disposed on a side relatively close to the second chip stack 120 in the offset direction, for example, the left side. This is in order for connection with a third connection terminal 178 of the third interposer 170 disposed over the second interposer 160. Thus, as illustrated in FIG. 3B, the second upper via pads 166 may be arranged in a line in the third direction while located relatively on the left side, and connected to the corresponding third connection terminals 178. The second through via 162 and the second lower via pad 164 may also be formed at a position corresponding to the second upper via pad 166, when seen from the top.

The second through via structure 162, 164, and 166 needs to be connected to the first interposer 150 disposed under the second interposer 160. However, while the second through via structure 162, 164, and 166 is disposed on a side relatively close to the second chip stack 120 in the offset direction, for example, the left side, the other-side first through via structure 152B, 154B, and 156B of the first interposer 150 is disposed on a side relatively far from the second chip stack 120 in the offset direction, for example, the right side. Thus, it may be required to form a redistribution conductive layer 169 and 169' for connecting the second through via structure 162, 164, and 166 and the other-side first through via structure 152B, 154B, and 156B. Specifically, as illustrated in FIGS. 3A and 3C, a redistribution line 169 and a redistribution pad 169' may be formed on the bottom surface of the second body part 161, 163, and 165. The redistribution line 169 may be extended to the right while electrically connected to the second lower via pad 164, and the redistribution pad 169' may overlap the other-side first upper via pad 156B while constituting an end of the redistribution line 169. The second lower via pads 164 on the one side and the redistribution pads 169' on the other side may be arranged in the third direction so as to one-to-one correspond to each other. Except portions exposed by redistribution dielectric layers DL1 and DL2 surrounding the redistribution conductive layer 169 and 169', the redistribution conductive layer 169 and 169' may be prevented from being electrically connected to the other components. Specifically, a first redistribution dielectric layer DL1 covering the bottom surface of the second body part 161, 163, and 165 may have an opening to expose the second lower via pad 164. The redistribution line 169 may fill the opening of the first redistribution dielectric layer DL1 so as to be electrically connected to the second lower via pad 164, and be extended on the bottom surface of the first redistribution dielectric layer DL1. The redistribution line 169 may be extended in a line shape with a small critical dimension (CD), but have an end with a large CD. A second redistribution dielectric layer DL2 may have an opening to expose the end of the redistribution line 169, while covering the redistribution line 169 and the first redistribution dielectric layer DL1. A portion of the end of the redistribution line 169, exposed through the opening formed in the second redistribution dielectric layer DL2, may constitute the redistribution pad 169'.

The second connection terminal 168 may be a conductive bump which fills the opening formed in the second redistribution dielectric layer DL2 so as to be connected to the redistribution pad 169', and is connected to the other-side first upper via pad (156B of FIG. 2A) of the first interposer 150.

The second dummy pad 167 may be further formed in an empty space on the line where the second lower via pads 164 are arranged. Although not illustrated, the second dummy pad 167 may be formed in the second lower dielectric layer 163. In this case, the redistribution dielectric layers DL1 and DL2 may have an additional opening to expose the second dummy pad 167. The second dummy pad 167 may be formed at a position overlapping the above-described first dummy pad 157, when seen from the top.

The first dummy pattern DP1 may prevent the second body part 161, 163, and 165 from being inclined to one side, while the bottom and top surfaces thereof are connected to the first dummy pad 157 and the second dummy pad 167, respectively. In other words, because the one side of the second body part is supported by the first dummy pattern DP1, the bottom surface of the second body part may be maintained in parallel to the top surface of the first body part. The first dummy pattern DP1 may be a conductive bump. In this case, the first dummy pattern DP1 may be formed through the same process as the process of forming the second connection terminal 168. However, the present embodiment is not limited thereto, but the material and shape of the first dummy pattern DP1 may be modified in various manners, as long as the first dummy pattern DP1 can support the second body part 161, 163, and 165.

In the present embodiment, the second interposer 160 having the illustrated shape has been described. However, the present embodiment is not limited thereto. A substrate, a semiconductor chip and the like, which have various shapes and various wiring structures capable of providing electrical connection between the first interposer 150 and the third interposer 170, may be used as the second interposer 160.

The third interposer 170 may be disposed over the second interposer 160, and spaced a distance from the third chip stack 130. The bottom surface of the fourth chip stack 140, which partially protrudes to the one side, for example, the left side from the third chip stack 130, may overlap a portion of the third interposer 170. The third interposer 170 may be extended over the top surface of the second chip stack 120. The third interposer 170 may be disposed in contact with the bottom surface of the protruding portion of the fourth chip stack 140, and serve to support the fourth chip stack 140. Furthermore, the third interposer 170 may provide electrical connection between the fourth chip stack 140 and the second interposer 160. The thickness of the third interposer 170 may be substantially equal to a value obtained by subtracting the sum of the first and second thicknesses H1 and H2 from the third thickness H3. The third interposer 170 is described in more detail with reference to FIGS. 4A to 4C.

Figure 4A:
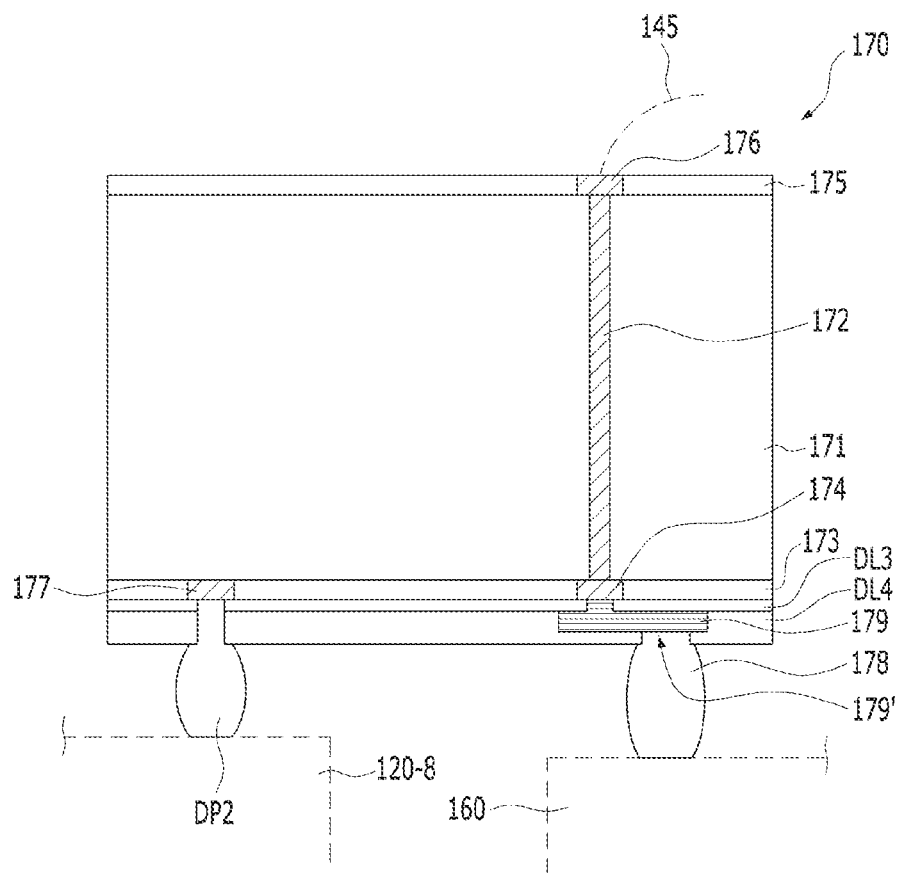
FIGS. 4A, 4B, and 4C are diagrams illustrating an example of the third interposer 170 of FIG. 1 in more detail.
Figure 4B:
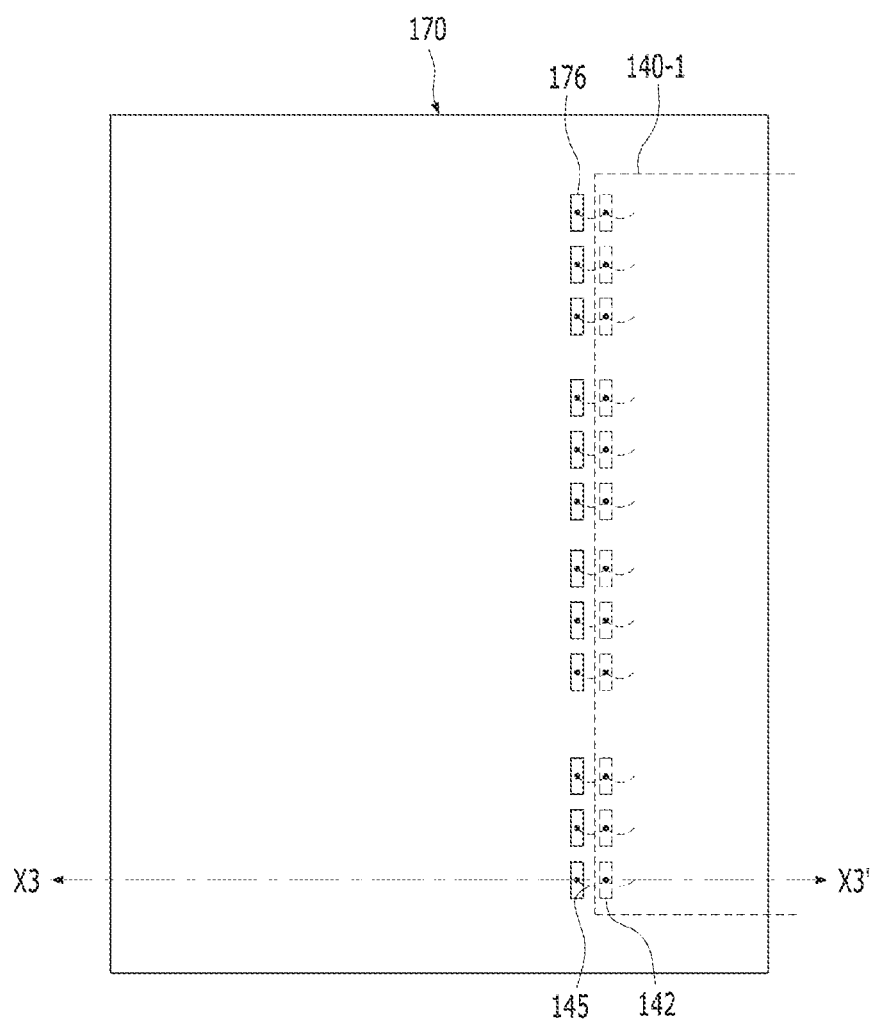
Figure 4C:
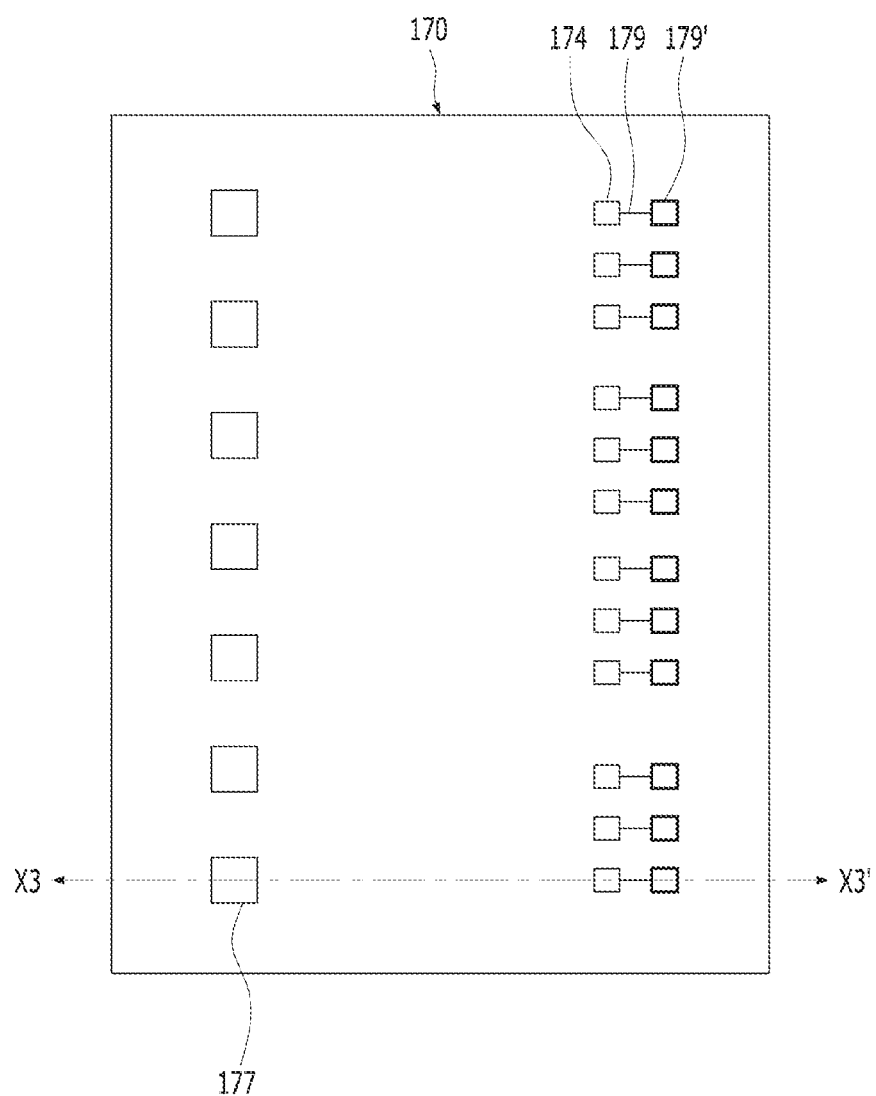

FIGS. 4A to 4C are diagrams illustrating an example of the third interposer 170 of FIG. 1 in more detail. FIG. 4A illustrates a cross-section taken along line X3-X3' of FIG. 4B or 4C, FIG. 4B illustrates the top surface of the third interposer 170, and FIG. 4C illustrates the bottom surface of the third interposer 170 except the third connection terminal 178 and a second dummy pattern DP2. For convenience of description, FIG. 4A illustrates the third interposer 170 and portions of the components connected to the third interposer 170, for example, portions of the second interposer 160 and the second and fourth chip stacks 120 and 140.

Referring to FIGS. 1, 4A, 4B, and 4C, the third interposer 170 may include a third body part 171, 173, and 175, a third through via structure 172, 174, and 176 formed through the third body part 171, 173, and 175, the third connection terminal 178 formed under the third body part 171, 173, and 165 so as to provide connection between the third through via structure 172, 174, and 176 and the second interposer 160, and the second dummy pattern DP2 for supporting the third interposer 170.

The third body part 171, 173, and 175 may have a rectangular cylinder shape or a similar shape thereto as a whole, and include a third body 171 and third lower and upper dielectric layers 173 and 175 disposed at the bottom and top of the third body 171. The third body part 171, 173, and 175 may have a plan shape whose other-side portion overlaps a protruding portion of the fourth chip stack 140 and the second through via structure 162, 164, and 166 of the second interposer 160, and one-side portion overlaps the uppermost second semiconductor chip 120-8. In particular, as the overlap area between the third body part 171, 173, and 175 and the uppermost second semiconductor chip 120-8 is increased, the empty space provided on the top surface of the third body part 171, 173, and 175 may be increased. Thus, various semiconductor devices (not illustrated) such as a nonvolatile memory controller may be additionally formed on the top surface of the third body part 171, 173, and 175.

The third through via structure 172, 174, and 176 may include a third through via 172 and third lower and upper via pads 174 and 176. The third through via 172 may be extended in a vertical direction through the third body 171, and the third lower and upper via pads 174 and 176 may be formed in the third lower and upper dielectric layers 173 and 175, respectively, and connected to the bottom and top of the third through via 172, respectively.

The third through via structure 172, 174, and 176 may be disposed on a side relatively close to the fourth chip stack 140 in the offset direction, for example, the right side. Thus, as illustrated in FIG. 4C, the third upper via pads 176 may be arranged in a line in the third direction while located relatively on the right side, and connected to the corresponding fourth chip pads 142 through the fourth inter-connector 145. The third through via 172 and the third lower via pad 174 may also be formed at a position corresponding to the third upper via pad 176, when seen from the top.

The third through via structure 172, 174, and 176 needs to be connected to the second interposer 160 disposed under the third interposer 170. However, when the third through via structure 172, 174, and 176 and the second through via structure 162, 164, and 166 are not aligned with each other, it may be required to form a redistribution conductive layer 179 and 179' for connecting the through via structure 172, 174, and 176 and the second through via structure 162, 164, and 166. Specifically, as illustrated in FIGS. 4A and 4C, the redistribution conductive layer 179 and 179' may include a redistribution line 179 and a redistribution pad 179' which are formed on the bottom surface of the third body part 171, 173, and 175. The redistribution line 179 may be extended to the right while electrically connected to the third lower via pad 174, and the redistribution pad 179' may overlap the second upper via pad 166 while constituting an end of the redistribution line 179. The third lower via pads 174 and the redistribution pads 179' may be arranged in the third direction so as to one-to-one correspond to each other. Except portions exposed by redistribution dielectric layers DL3 and DL4 surrounding the redistribution conductive layer 179 and 179', the redistribution conductive layer 179 and 179' may be prevented from being electrically connected to other components.

The third connection terminal 178 may be a conductive bump which fills an opening formed in a second redistribution dielectric layer DL2 so as to be connected to the redistribution pad 179', and is connected to the second upper via pad 166.

A third dummy pad 177 may be further formed in a region overlapping the uppermost second semiconductor chip 120-8. The third dummy pad 177 may be formed in the third lower dielectric layer 173. In this case, the redistribution dielectric layers DL1 and DL2 may have an additional opening to expose the third dummy pad 177. The third dummy pad 177 may be located in the overlap region with the uppermost second semiconductor chip 120-8, and the number, shape, size and arrangement of the third dummy pads 177 may be modified in various manners.

The second dummy pattern DP2 may prevent the third body part 171, 173, and 175 from being inclined in the region overlapping the uppermost second semiconductor chip 120-8, while the bottom and top surfaces thereof are connected to the top surface of the uppermost second semiconductor chip 120-8 and the third dummy pad 177, respectively. The second dummy pattern DP2 may be a conductive bump. The second dummy pattern DP2 may have a smaller size and height than the third connection terminal 178. However, according to the thickness of the second interposer 160, the relative sizes and heights of the second dummy pattern DP2 and the third connection terminal 178 may be varied. The second dummy pattern DP2 may be formed through the same process as the third connection terminal 178. However, the present embodiment is not limited thereto, but the material and shape of the second dummy pattern DP2 may be modified in various manners, as long as the second dummy pattern DP2 can support the third body part 171, 173, and 175.

In the present embodiment, the third interposer 170 having the illustrated shape has been described. However, the present embodiment is not limited thereto. A substrate, a semiconductor chip and the like, which have various shapes and various wiring structures capable of providing electrical connection between the fourth chip stack 140 and the second interposer 160, may be used as the third interposer 170.

Therefore, the fourth chip stack 140 may be electrically connected to the substrate 100, or specifically the first substrate pad 102-3 through the first to third interposers 150, 160, and 170.

Referring back to FIG. 1, the external connection terminal 180 may be connected to each of the second substrate pads 104 disposed on the second surface of the substrate 100. In the present embodiment, solder balls are illustrated as the external connection terminals 180. However, the present embodiment is not limited thereto, but various types of electrical connectors including various conductive materials may be used as the external connection terminals 180. The package in accordance with the present embodiment may be connected to various external devices (not illustrated) such as a module substrate through the external connection terminals 180.

The above-described semiconductor package 50 may include the plurality of chip stacks each having the plurality of semiconductor chips, and the stacked structure of the first and second chip stacks 110 and 120 and the stacked structure of the third and fourth chip stacks 130 and 140 may have arrow shapes facing the opposite directions, thereby increasing the degree of integration of the semiconductor package 50.

Furthermore, as the thickness of the third chip stack 130 is increased to more than those of the first, second and fourth chip stacks 110, 120, and 140, portions of the first and second interposers 150 and 160 and/or portions of the first and second chip stacks 110 and 120 may be pushed into the space formed under the third chip stack 130, which makes it possible to reduce the area of the semiconductor package 50.

Furthermore, because the overlap area between the third interposer 170 and the second chip stack 120 is adjusted to secure the space on the third interposer 170, it is possible to form an additional semiconductor chip having a different function from the semiconductor chips included in the first to fourth chip stacks 110, 120, 130, and 140, thereby acquiring a multi-function semiconductor package.

In accordance with the present embodiments, the degree of integration of a semiconductor package can be increased while the area thereof is reduced.

Figure 5:
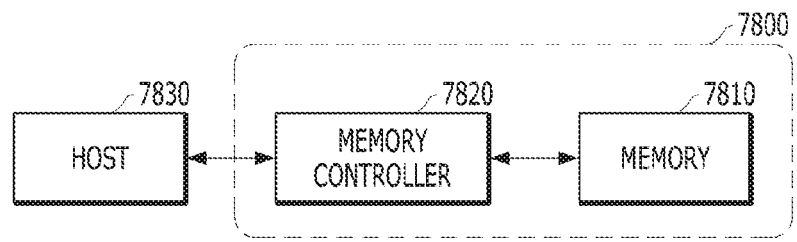
FIG. 5 shows a block diagram illustrating an electronic system employing a memory card including a semiconductor package, according to an embodiment.

FIG. 5 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 6:
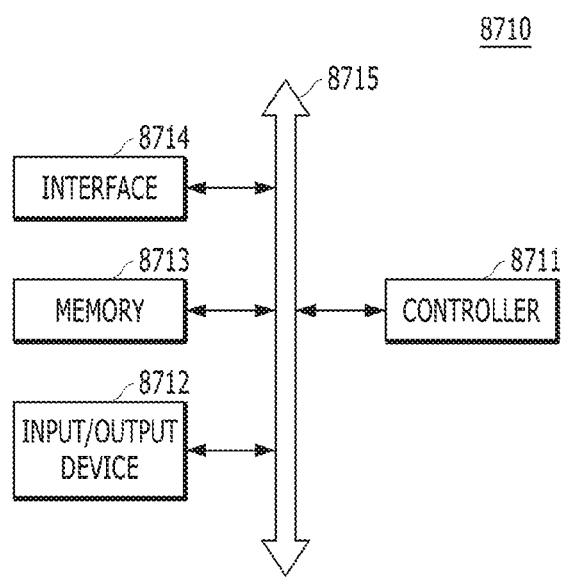
FIG. 6 shows a block diagram illustrating another electronic system including a semiconductor package, according to an embodiment.

FIG. 6 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the following claims.

What is claimed is:

1. A semiconductor package comprising:
    a substrate;
    a first interposer disposed over the substrate;
    a first chip stack disposed on the substrate on one side of
      the first interposer, wherein the first chip stack comprises a plurality of first semiconductor chips stacked with an offset in a first direction;
a second chip stack disposed on the first chip stack, wherein the second chip stack comprises a plurality of second semiconductor chips stacked with an offset in a second direction opposite to the first direction; and
a third chip stack disposed on the substrate on an other side of the first interposer, wherein the third chip stack comprises a plurality of third semiconductor chips stacked with an offset in the second direction,
wherein the first interposer is contacted by a bottom surface of the second chip stack that protrudes beyond the first chip stack in the first direction,
wherein the third chip stack has a thickness larger than the sum of thicknesses of the first and second chip stacks, and
wherein the third chip stack extends over at least a portion of the first interposer so that the at least a portion of the first interposer is located in a space under the third chip stack.

2. The semiconductor package of claim 1, wherein the first interposer is electrically connected between the second chip stack and the substrate.

3. The semiconductor package of claim 2, wherein the first chip stack is electrically connected to the substrate through a first inter-connector located on the one side of the first chip stack, corresponding to the opposite side of the other side of the first chip stack, wherein the other side of the first chip stack is closer to the first interposer, and
the third chip stack is electrically connected to the substrate through a third inter-connector located on the other side of the third chip stack, wherein the other side of the third chip stack is opposite to the one side of the third chip stack, wherein the one side of the third chip stack is closer to the first interposer.

4. The semiconductor package of claim 1, wherein the first interposer has the same thickness as the first chip stack.

5. The semiconductor package of claim 1, further comprising a fourth chip stack disposed on the third chip stack, wherein the fourth chip stack comprises a plurality of fourth semiconductor chips stacked with an offset in the first direction.

6. The semiconductor package of claim 5, further comprising:
a third interposer contacted by a bottom surface of the fourth chip stack that protrudes beyond the third chip stack in the second direction; and
a second interposer disposed between the third interposer and the first interposer.

7. The semiconductor package of claim 6, wherein the third chip stack has a thickness equal to the sum of thicknesses of the first, second, and third interposers.

8. The semiconductor package of claim 6, wherein:
the first interposer is electrically connected between the second chip stack and the substrate and electrically connected between the second interposer and the substrate;
the second interposer is electrically connected between the first interposer and the third interposer; and
the fourth chip stack is electrically connected to the substrate through the third interposer, the second interposer, and the first interposer.

9. The semiconductor package of claim 8, wherein the first interposer comprises:
a one-side first through via structure disposed on a side relatively close to the second chip stack, wherein the second chip stack and the substrate are electrically connected through the one-side first through via structure; and
an other-side first through via structure disposed on a side relatively far from the second chip stack, wherein the second interposer and the substrate are electrically connected through the other-side first through via structure,
wherein the second interposer comprises:
a second connection terminal electrically connected to the other-side first through via structure; and
a first dummy pattern formed in a region where the one-side first through via structure is not formed.

10. The semiconductor package of claim 9, wherein the widths of the first and second interposers in a third direction perpendicular to the first and second directions are larger than a width of the first chip stack, such that the first and second interposers have an end which does not overlap the first chip stack, and
the first dummy pattern is disposed between the first and second interposers at the end.

11. The semiconductor package of claim 9, wherein the second interposer comprises:
a second through via structure; and
a first redistribution layer suitable for electrically connecting the second through via structure to the other-side first through via structure.

12. The semiconductor package of claim 11, wherein the third interposer comprises:
a third through via structure; and
a second redistribution layer suitable for electrically connecting the third through via structure to the second through via structure.

13. The semiconductor package of claim 6, wherein the second interposer has a thickness equal to or less than a value obtained by subtracting the thickness of the first chip stack from the sum of thicknesses of the first and second chip stacks.

14. The semiconductor package of claim 6, wherein the third interposer extends over a top surface of the second chip stack.

15. The semiconductor package of claim 14, wherein the third interposer comprises a second dummy pattern configured to support the third interposer on the top surface of the second chip stack.

16. The semiconductor package of claim 6, wherein:
the first and second interposers have sidewalls which are aligned with each other in the first and second directions; and
the third interposer has a sidewall which is not aligned with the aligned sidewalls of the first and second interposers.

17. The semiconductor package of claim 1, wherein:
the first, second, and third semiconductor chips are the same types of memory chips;
the first and second semiconductor chips have the same thickness; and
the third semiconductor chips have a larger thickness than the thickness of the first and second semiconductor chips.

18. The semiconductor package of claim 5, wherein:
the first, second, third, and fourth semiconductor chips are the same types of memory chips;
the first, second, and fourth semiconductor chips have the same thickness; and the third semiconductor chips have a larger thickness than the thickness of the first, second, and fourth semiconductor chips.

\* \* \* \* \*